United States Patent [19]

Yamasita

[11] Patent Number: 5,880,632
[45] Date of Patent: Mar. 9, 1999

[54] TUBE AMPLIFIER HAVING SPECIAL CONFIGURATION WITH TWO OR MORE TUBES

[75] Inventor: Fujio Yamasita, Tokyo, Japan

[73] Assignee: Wako Technical Co., Ltd., Tokyo, Japan

[21] Appl. No.: 687,932

[22] Filed: Jul. 29, 1996

Related U.S. Application Data

[63] Continuation-in-part of Ser. No. 436,542, May 8, 1995, Pat. No. 5,680,074.

[30] Foreign Application Priority Data

May 9, 1994 [JP] Japan ..................................... 6-119639

[51] Int. Cl.[6] ...................................................... H03F 3/52
[52] U.S. Cl. ............................................. 330/70; 330/153
[58] Field of Search ............................... 330/70, 71, 152, 330/153, 165, 172, 123; 381/120

[56] References Cited

U.S. PATENT DOCUMENTS

| | | | |
|---|---|---|---|
| 2,529,459 | 11/1950 | Pourciau et al. | 330/70 |
| 2,810,025 | 10/1957 | Clements | 330/70 |
| 4,593,251 | 6/1986 | Smith | 330/123 |
| 5,302,912 | 4/1994 | Grant | 330/3 X |
| 5,680,074 | 10/1997 | Yamashita | 330/70 |

OTHER PUBLICATIONS

Tadatoku Shin, Radio Technique, pp. 157–158, 1A Press Co., Ltd., Jan. 1995.
Sei Yamane, Manual for Personally Producing Tube Amplifier, pp. 108–109, Denpa–Shinbun Co., Ltd., Jun. 1978.
Mayuni Cho, Tube Amplifier Free Design, pp. 192–193, Seibundo–Shinkosha Publishing Co., Ltd., Sep. 1990.
Naoki Watanabe, All About U.S. Tube Amplifiers, pp. 64–65, Seibundo–Shinkosha Publishing Co., Ltd., Nov. 1988.
Marekatsu Matsunami, Audio Technology MJ Wireless System and Experiments, pp. 130 and 132, Seibundo–Shinkosha Publishing Co., Ltd., Jun. 1993.
Isamu Nishimura, Audio Technology MJ Wireless System and Experiments, p. 122, Seibundo–Shinkosha Publishing Co., Ltd. Jun. 1993.
Isamu Nishimura, Audio Technology MJ Wireless System and Experiments, pp. 28 and 30, Seibundo–Shinkosha Publishing Co., Ltd., Feb. 1994.
Mayo Cho, Audio Technology MJ Wireless System and Experiments, pp. 28, 30, 33 and 35, Seibundo–Shinkosha Publishing Co., Ltd., Apr. 1994.
Marekatsu Matsunami, Audio Technology MJ Wireless System and Experiments, pp. 142 and 144, Seibundo–Shinkosha Publishing Co., Ltd., Mar. 1995.

*Primary Examiner*—Steven Mottola
*Attorney, Agent, or Firm*—McDermott, Will & Emery

[57] ABSTRACT

There is provided a tube amplifier comprising a first vacuum tube K3 having a plate applied with a positive voltage and a cathode applied with a negative voltage by a first resistor, a second vacuum tube K4 having a grid connected to the cathode of the first vacuum tube and a cathode or a heater applied with a voltage close to a potential of zero in relation to a plate voltage, and an output transformer TF1 having a first coil and a second coil which is connected to a loudspeaker, said first coil having a terminal connected to the plate of the second vacuum tube and another terminal applied with a positive voltage. Also, time means is used to optimally maintain the grid voltage of the second vacuum tube when the power source is turned on, and the plate voltage of another vacuum tube K1 provided in a preceding stage of the first vacuum tube is controlled to maintain the negative voltage applied to the grid of the second vacuum tube at a desired value.

9 Claims, 9 Drawing Sheets

TUBE AMPLIFIER HAVING SPECIAL CONFIGURATION WITH TWO OR MORE TUBES

RELATED APPLICATION

This application is a continuation-in-part of my application Ser. No. 08/436,542, filed May 8, 1995 and entitled "Tube Amplifier Having Specific Configuration With Four Tubes" (as amended) and now U.S. Pat. No. 5,680,074.

BACKGROUND OF THE INVENTION

1. Field of the Invention

The present invention relates to an audio amplifier, and particularly, to a so-called tube amplifier using vacuum tubes.

2. Description of the Prior Art

Various tube amplifiers have conventionally been proposed. Most of those amplifiers use a capacitor for connecting stages to each other. Specifically, in order that a positive high voltage applied to a plate (anode) of a vacuum tube in a preceding stage is not applied to a grid of a vacuum tube in a succeeding stage, a capacitor of about 0.05 $\mu$F is inserted between the plate of the vacuum tube in the preceding stage and the grid of the succeeding stage, and a signal is transmitted from the preceding stage to the succeeding stage through the capacitor.

In addition, am amplifier using no capacitor between stages is known as a kind of direct-current amplifier or the like, but is not suitable for power-amplification of an audio signal.

SUMMARY OF THE INVENTION

In case where a capacitor is used for connecting stages with each other, there is a drawback that deformation in waveform of an audio signal occurs when the audio signal passes the capacitor, and it causes deterioration in sound quality.

Therefore, the present invention has an object of providing a tube amplifier which can amplify the waveform of an audio signal with a high fidelity, without using a capacitor between stages.

In order to achieve the object, the present invention is arranged such that a capacitor is not used for connecting stages with each other, the cathode of a vacuum tube in a preceding stage is directly connected to the grid of a vacuum tube in a succeeding stage, and the vacuum tube in the preceding stage is connected by cathode-follower connection thereby to optimally set voltages supplied to electrodes of respective vacuum tubes.

Specifically, according to the present invention, there is provided a tube amplifier comprising:

a first vacuum tube forming a preceding stage and having a plate applied with a positive voltage and a cathode applied with a negative voltage by a first resistor;

a second vacuum tube having a grid connected to the cathode of the first vacuum tube and the cathode or a heater applied with a voltage close to a potential of zero in relation to a plate voltage; and an output transformer having a first coil and a second coil which is connected to a loud-speaker, said first coil having a terminal connected to the plate of the second vacuum tube and another terminal applied with a positive voltage.

In addition, according to the present invention, use of timer means enables optimal maintenance of a grid voltage of the second vacuum tube when the power is turned on. Further, a plate voltage of another vacuum tube provided in a preceding stage of the first vacuum tube is controlled, so that a negative voltage applied to the grid of the second vacuum tube can be maintained at a desired value.

DETAILED DESCRIPTION OF THE EMBODIMENTS

Figure 1:
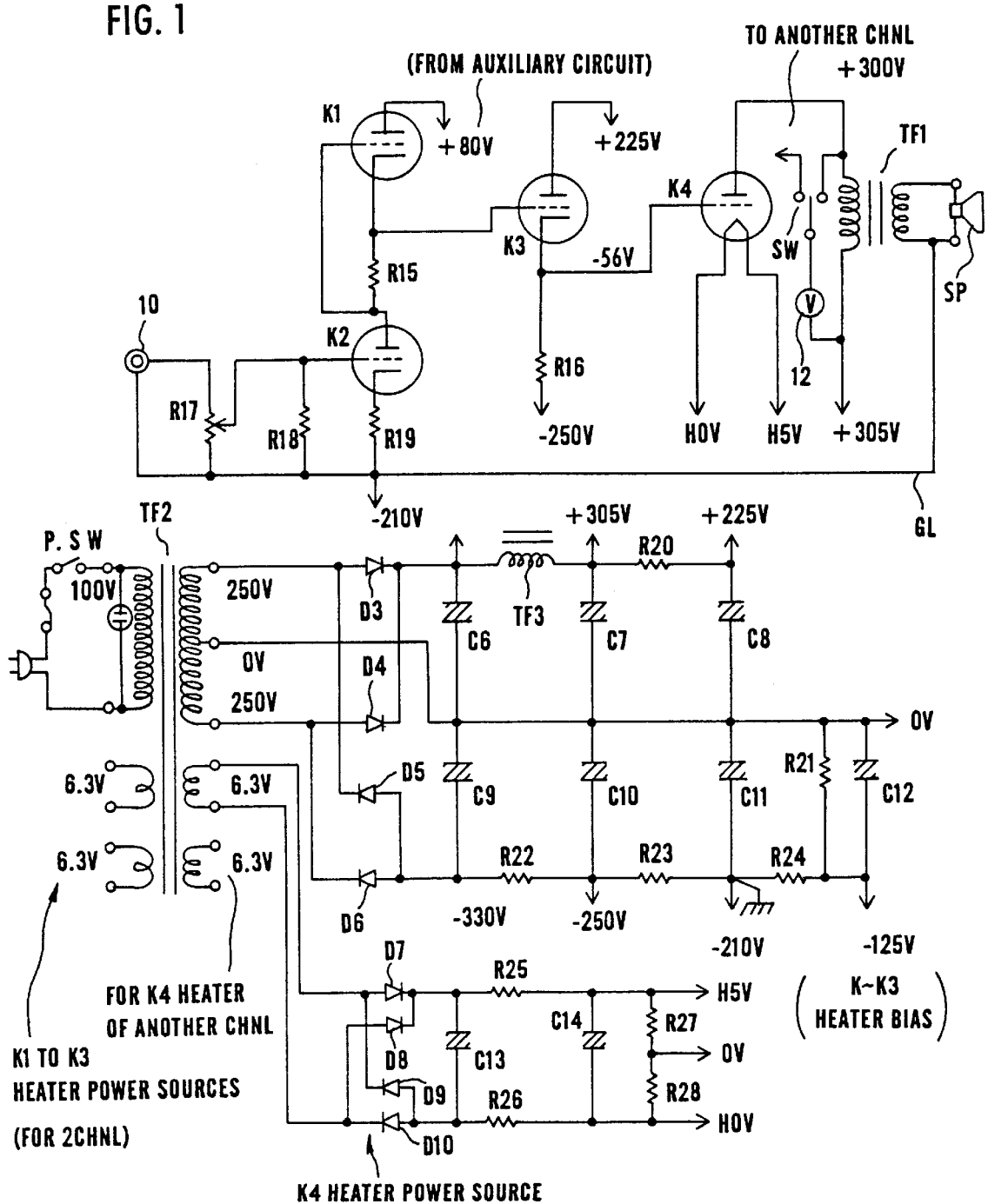
FIG. 1 is a block diagram showing a main part of a first embodiment of the tube amplifier according to the present invention.

In the following, preferred embodiments of the present invention will be explained with reference to the drawings. FIG. 1 is a wiring diagram of a preferred embodiment of a tube amplifier according to the present invention. A power source circuit is shown in a lower portion of FIG. 1, and includes a power source transformer TF2, diodes D3 to D10, electrolytic capacitors C6 to C14, a choke coil TF3, and resistors R20 to R28. A direct current power source of a voltage shown in the figure and of an alternating current for a heater are supplied by this structure. Specifically, this voltage is supplied to those portions which are indicated by arrows in the amplifier and are denoted with power the same voltage values as those shown in the power source circuit.

A reference numeral 10 denotes an input terminal which is supplied with an output signal from a reproducing device such as a CD player, a tape deck, or the like. A terminal end of the input terminal 10 is connected to a terminal of a variable resistor R17, while another terminal end of the input terminal 10 is connected to a ground line GL. Also, another terminal of the variable resistor R17 is connected to the ground line GL. Note that the ground line GL is not set to 0 V, but is applied with a negative high voltage of −210 V in this embodiment, as shown in the figure. The variable resistor R17 has a movable terminal connected to a grid of a vacuum tube K2, and this grid is connected to the ground line GL through a resistor R18. The vacuum tube K2 has a cathode connected to the ground line GL through a resistor R19, and also has a plate which is directly connected to a grid of a vacuum tube K1 and is simultaneously connected to a cathode of the tube K1 through a resistor R15. The vacuum tube K1 has a plate applied with a voltage of +80 V.

The cathode of the vacuum tube K1 is directly connected to a grid of a vacuum tube K3. The vacuum tube K3 has a plate applied with a voltage of +225 V, and a cathode supplied with a voltage of −250 V through a resistor 16. The vacuum tube K3 has a cathode directly connected to a grid of another vacuum tube K4, and a plate connected to a terminal of a first coil of an output transformer TF1. Another terminal of the first coil of the output transformer TF1 is applied with a voltage of +305 V. The vacuum tube K4 has a heater applied with a heater power voltage indicated by H0 V and H5 V.

Although the heater power voltage indicated by H0 V and H5 V stated above is a direct power source voltage of 5 V, as shown in the lowermost portion of FIG. 1, resistors R27 and R28 are directly connected to each other, and the middle point therebetween is connected to a line of 0 V, and therefore, the heater of the vacuum tube K4 is substantially set to a voltage close to 0 V, depending on a relationship with a plate voltage of the vacuum tube K4. The output transformer TF1 has a second coil connected to a loud-speaker not shown, and another terminal thereof is connected to the ground line GL.

Since the amplifier portion shown in the upper half of FIG. 1 is used for one single channel, another amplifier portion must be prepared for another channel in case of a stereo system. A voltage meter 12 is connected between both ends of the second coil of the output transformer, with a switch SW inserted therebetween. This voltage meter 12 is used to carry out a manual adjustment which will be described later, and applies a direct current voltage meter of about 10 V. The switch SW is prepared to simultaneously use the voltage meter 12 for another channel in view of a stereo system.

Tubes of the following item numbers may be used for vacuum tubes K1, K2, K3, and K4.

K1, K2 . . . 12AX7

K3 . . . 6S4-A

K4 . . . 300B

Meanwhile, the resistors R15 to R19 should desirably have resistance close to the following values.

R15 . . . 1K Ω

R16 . . . 10k Ω

R17 . . . 100k Ω (VR character: A)

R18 . . . 100k Ω

R19 . . . 1k Ω

Cited current values denote preferred values of plates.

Vacuum tube . . . K1 (1 mA)

Vacuum tube . . . K3 (19.5 mA)

Vacuum tube . . . K2 (1 mA)

Vacuum tube . . . K4 (60 mA)

Figure 2:
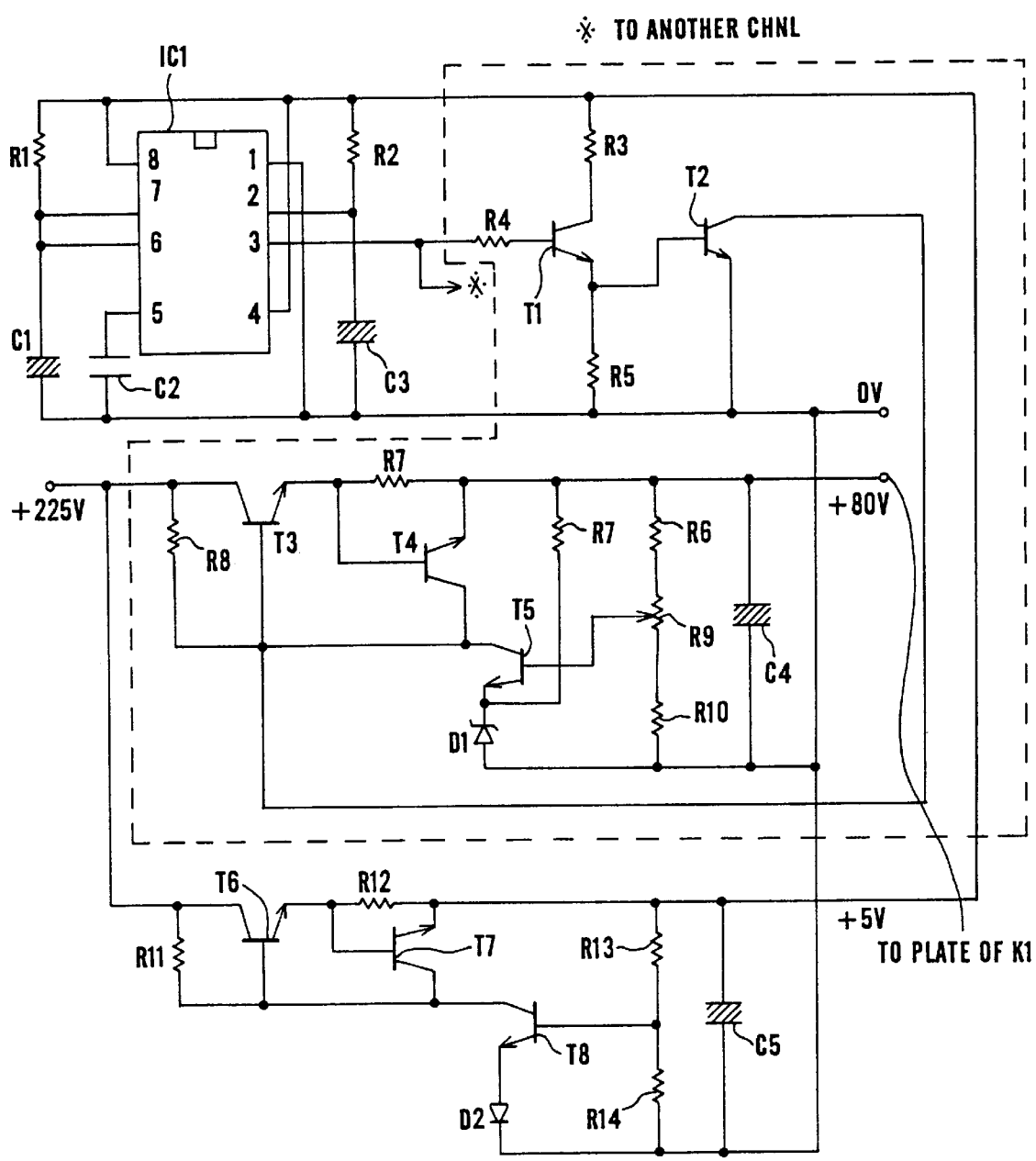
FIG. 2 is a block diagram showing an auxiliary circuit portion of the first embodiment shown in FIG. 1.

In the following, an auxiliary circuit shown in FIG. 2 will be explained. This auxiliary circuit has an integrated circuit 1C1 for a timer, which functions as a timer circuit and also serves to manually adjust the plate voltage of the vacuum tube K1. In FIG. 2, references R1 to R14 denote resistors, C1 to C5 denote capacitors, T1 to T8 denote resistors, and references D1 to D2 respectively denote a zener diode and a normal diode. The resistor R9 is a variable resistor. A product No. NE555 available from Toshiba Co., Ltd. may be used as the integrated circuit for a timer.

This timer circuit is supplied with a voltage of +225 V from a power source circuit shown in a lower portion of FIG. 1, and serves to supply a direct current of +80 V, which is to be supplied to the vacuum tube K1, after a predetermined time from when the power is turned on. In addition, the output voltage of +80 V can be changed within a predetermined width, by manually adjusting the variable resistor R9, and as a result, the grid voltage of the vacuum tube K4 shown in FIG. 1 can be set to a value close to −56 V indicated in the figure. Further, the portion surrounded by a broken line in FIG. 2 is prepared for each channel. Therefore, this portion of FIG. 2 corresponds to one channel (CHNL) in case of a stereo system, for example.

In the following, operations of the circuits shown in FIGS. 1 and 2 will be explained in more detail. When the power switch P.SW shown in a lower portion of FIG. 1 is turned on, the power source of the heater of each vacuum tube is turned on and a plate voltage is applied to vacuum tubes K3 and K4. However, the integrated circuit IC1 for a timer operates to maintain the transistor T1 turned on until a predetermined time passes. Therefore, the transistor T2 is turned on. As a result, the transistor T3 is turned OFF, so that the voltage of the output terminal indicated as +80 V is close to 0 V. A time constant of the timer circuit is decided, depending on values of the resistor R1 and the capacitor C1. Where R1 is 1MΩ and C1 is 22 μg F, the transistor T1 is turned on after 28 seconds from turning-on of the power source. For example, where the capacitor C1 is 10 μF, the transistor T1 is turned on after 13 seconds. Where the capacitor C1 is 33 μF, the transistor T1 is turned on after 39 seconds. Furthermore, if the resistor R1 is a variable resistor, a desired time can manually be set.

When the set time has passed, the transistors T1 and T2 are turned off, and as a result, the transistor T3 is turned on so that an output of +80 V is obtained. This voltage is applied to the plate of the vacuum tube K1 shown in FIG. 1. This kind of time circuit is provided because the vacuum tube K3 is almost cut off immediately after the power source is turned on, thereby preventing a voltage drop due to the resistor R16, so that the grid of the vacuum tube K4 has a voltage of −10 V which is much higher than a desired voltage when no signals are supplied and it takes about 20 seconds to recover a regular voltage of −56 V. In other words, a timer circuit is provided in order to make the vacuum tube K1 in the input state operate after the grid of the vacuum tube K4 recovers a regular voltage of −56 V.

As has been explained above, the variable resistor R9 is provided to make a manual adjustment for changing the plate voltage of the vacuum tube K1 within a range of, e.g., +50 V to +100, when no signals are supplied, while monitoring the voltage meter 12 connected to the first coil of the output transformer TF1 shown in FIG. 1. This prevents the grid voltage of the vacuum tube K4 from rising or falling from a regular voltage of −56 V due to manufacturing errors of the vacuum tube K4, due to replacement thereof, or due to time-dependent changes of respective parts. Specifically, the grid voltage of the vacuum tube K4 is set by adjusting the plate voltage of the vacuum tube K1.

In the above embodiment, a product of item No. 300B having no cathode is used as the vacuum tube K4. However, when a vacuum tube having a cathode is used, the cathode voltage is set to a value close to 0 V. After the timer circuit is turned on, normal operation starts. The vacuum tubes K1 and K2 constitute an input amplifier stage and a signal is supplied in form of a cathode follower of the vacuum tube K1 to the vacuum tube K3 in a next stage. The vacuum tube K3 adopts the form of a cathode follower and therefore has a cathode connected to the grid of the vacuum tube K4 in the next stage. Signals thus amplified are supplied, one after another, to the vacuum tube K4 constituting a final stage, and are subjected to power-amplification in this tube K4. The signals are then supplied to a loud-speaker not shown through the output transformer TF1. The same operation as above is applicable to another channel. In addition, it is desirable to select a transformer using a permalloy core as an output transformer TF1, in view of reproduction with a high-fidelity.

Figure 3:
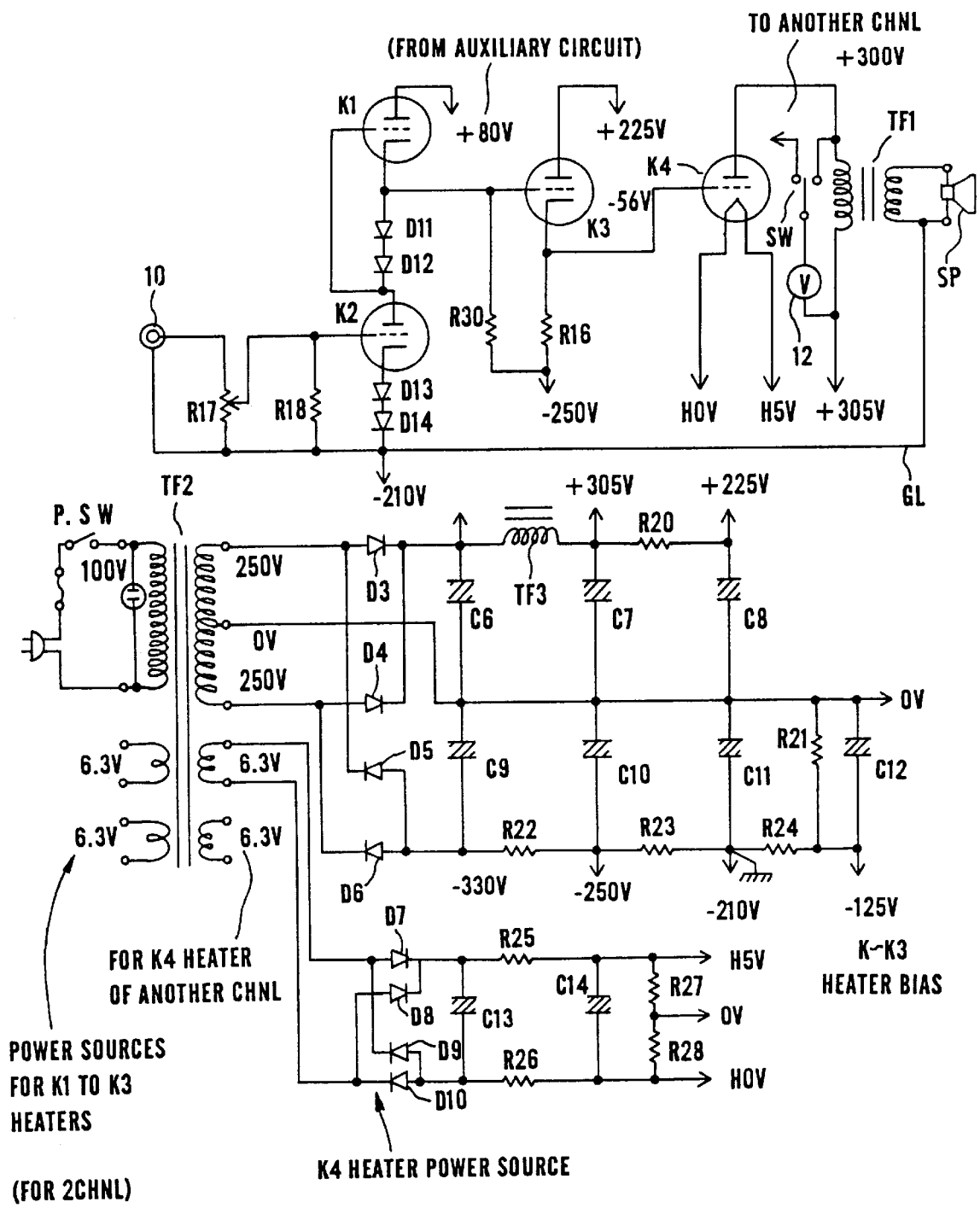
FIG. 3 is a block diagram showing a main part of a second embodiment of the tube amplifier according to the present invention.

In the following, a second embodiment of the present invention will be explained with reference to FIG. 3. The second embodiment shown in FIG. 3 is used together with the auxiliary circuit shown in FIG. 2, as in the first embodiment. Therefore, the following explanation of the second embodiment will be made only to points different from the first embodiment. Although a resistor R15 is inserted between the grid and cathode of the vacuum tube K1 of FIG. 1, this resistor is replaced with a serial circuit consisting of two diodes D11 and D12 in the second embodiment of FIG. 3. In the same way, a serial circuit consisting of diodes D13 and D14 is inserted between the grid and cathode of tube K2. Further, a resistor R30 is additionally inserted between the grid and cathode of the vacuum tube K3.

Note that the diodes D11, D12, D13 and D14 may be products of the following item No.

1S1830

Furthermore, the following resistance value is desirable for the resistor R30

R30 . . . 4.7M Ω

The resistors R15 and R19 connected to the cathodes of the vacuum tubes K1 and K2 in the first embodiment are replaced with diodes (1S1830) due to following reasons.
(1) Rising characteristic of a waveform can be improved when amplifying a square (rectangular) wave.
(2) Frequency characteristic can be improved within a range of 10 to 20 KHz.
(3) Distortion rate can be improved when an output is small.
(4) Drifting of currents passing through tubes K1 and K2 can be reduced even when the sound volume is changed by the resistor R17.

Furthermore, since a resistor R30 is connected between the grid and cathode of the vacuum tube K3, the bias voltage of the tube K3 can be maintained at a constant value, thereby preventing accidents, e.g., sequential defective operation of tubes K3 and K4 or break-down of tube bulbs which may caused by transition of the bias voltage of the tube K3 due to reasons such as short-circuiting, glow-discharging or the like in the tubes.

As has been specifically described above, the tube amplifier according to the first and second embodiments of the present invention comprises: a first vacuum tube forming a preceding stage and having a plate applied with a positive voltage and a cathode applied with a negative voltage by a first resistor; a second vacuum tube having a grid connected to the cathode of the first vacuum tube and a cathode or a heater applied with a voltage close to a potential of zero, depending on a relationship with a plate voltage; and an output transformer having a first coil and a second coil which is connected to a loud-speaker, said first coil having a terminal connected to the plate of the second vacuum tube and another terminal applied with a positive voltage. Therefore, this tube amplifier achieves signal-amplification with a high fidelity, without using a capacitor for connecting stages, and the quality of reproduced sounds is excellent. In addition, two vacuum tubes are used for an input stage, and a plate voltage is applied to one (i.e., the vacuum tube K1) of the tubes by time means, so that the vacuum tube K4 in the final stage can be protected when the power source is turned on. Further, the plate voltage of the vacuum tube K1 in the input stage can be manually controlled, and therefore, the grid voltage of the vacuum tube K4 in the final stage can be continuously set to a desired value when no signals are supplied.

Figure 4:
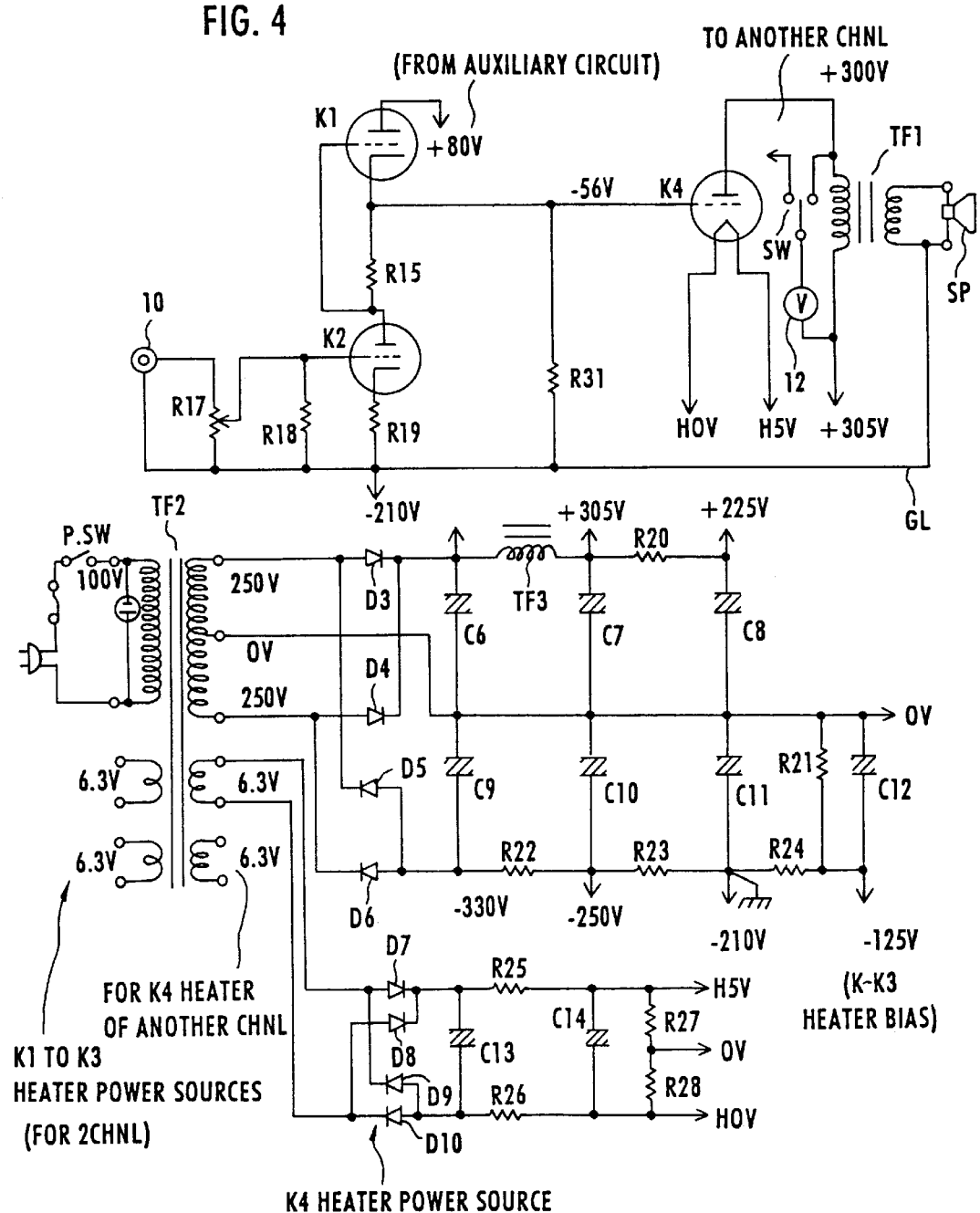
FIG. 4 is a wiring diagram of a third embodiment of the tube amplifier according to the present invention.

In the following, a third embodiment of the present invention will be described with reference to FIG. 4. The third embodiment of FIG. 4 is used together with the auxiliary circuit shown in FIG. 2 as in the first embodiment. The third embodiment differs from the first embodiment in that the tube K3 and the resistor R16 forming a cathode follower are removed such that the cathode of the tube K1 is directly connected to the grid of the tube K4, and a negative voltage 5 applied to the cathode of the tube K1 through a resistor R31. The resistor R31 should desirably have a resistance of 4.7M Ω. Other resistors and tubes K1 and K4 of the fourth embodiment are the same as those in the first embodiment. Although the tube K3 is removed, the third embodiment operates in a manner similar to the first embodiment. Since the tube K3 is removed, the third embodiment requires a smaller number of parts thus providing a simple configuration. On the other hand, the first and second embodiments using the tube K3 are advantageous when some amount of grid current flowing through the grid of the tube K4 is required because the presence of the tube K3 assures some such amount of grid current of the tube K4.

Figure 5:
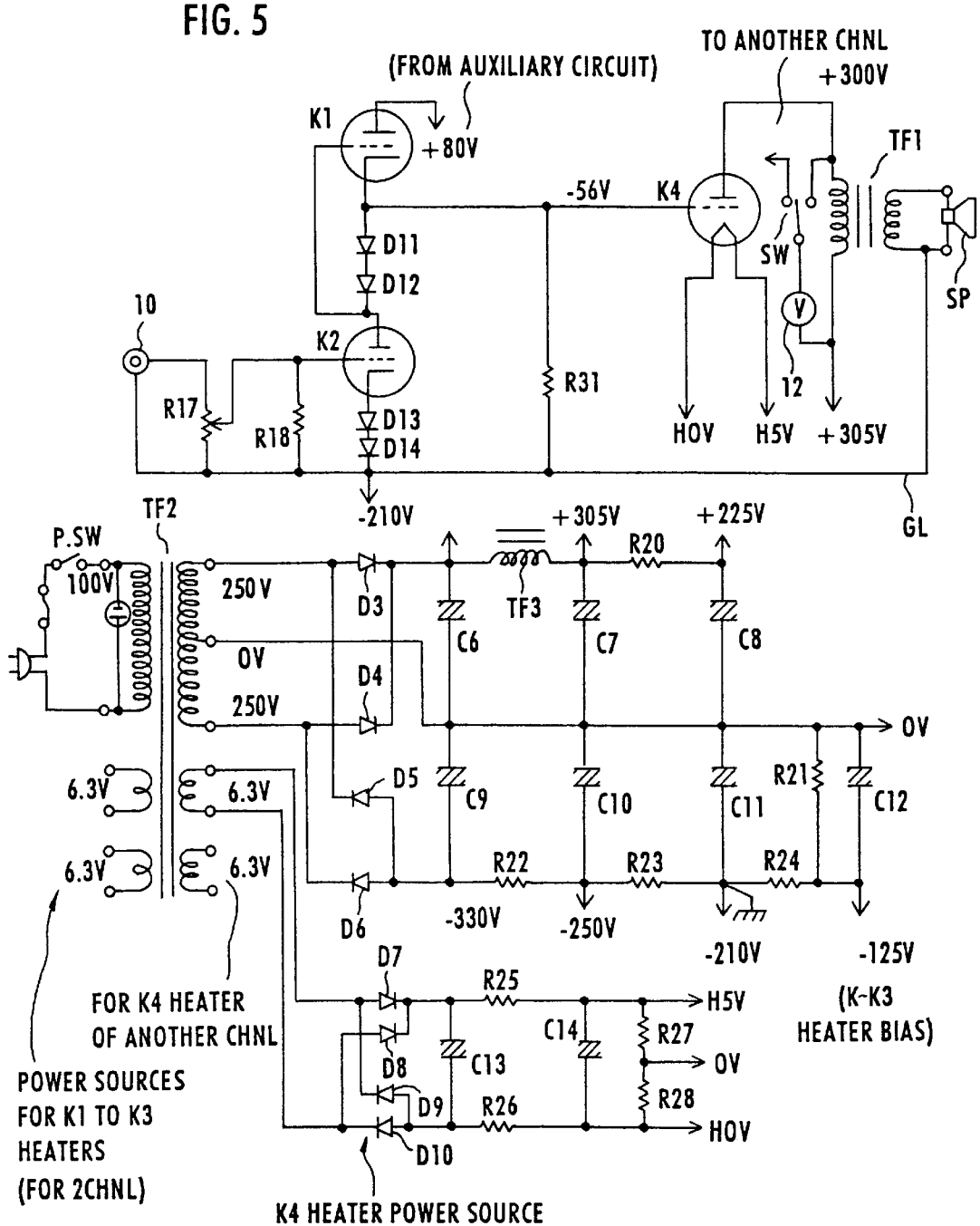
FIG. 5 is a wiring diagram of a fourth embodiment of the tube amplifier according to the present invention.

In the following, a further embodiment of the present invention will be described with reference to FIG. 5. The fourth embodiment of FIG. 5 is also used together with the auxiliary circuit shown in FIG. 2 as in the first and second embodiments. The fourth embodiment is a modification of the second embodiment and is also a modification of the third embodiment. More specifically, the fourth embodiment differs from the third embodiment in that the resistors R15 and R19 are respectively replaced with a series circuit of diodes D11 and D12, and with another series circuit of diodes D13 and D14. The fourth embodiment operates in the same manner as the third embodiment. The series circuit of the diodes D11 and D12 and another series circuit of the diodes D13 and D14 may be replaced with a zener diode.

Figure 6:
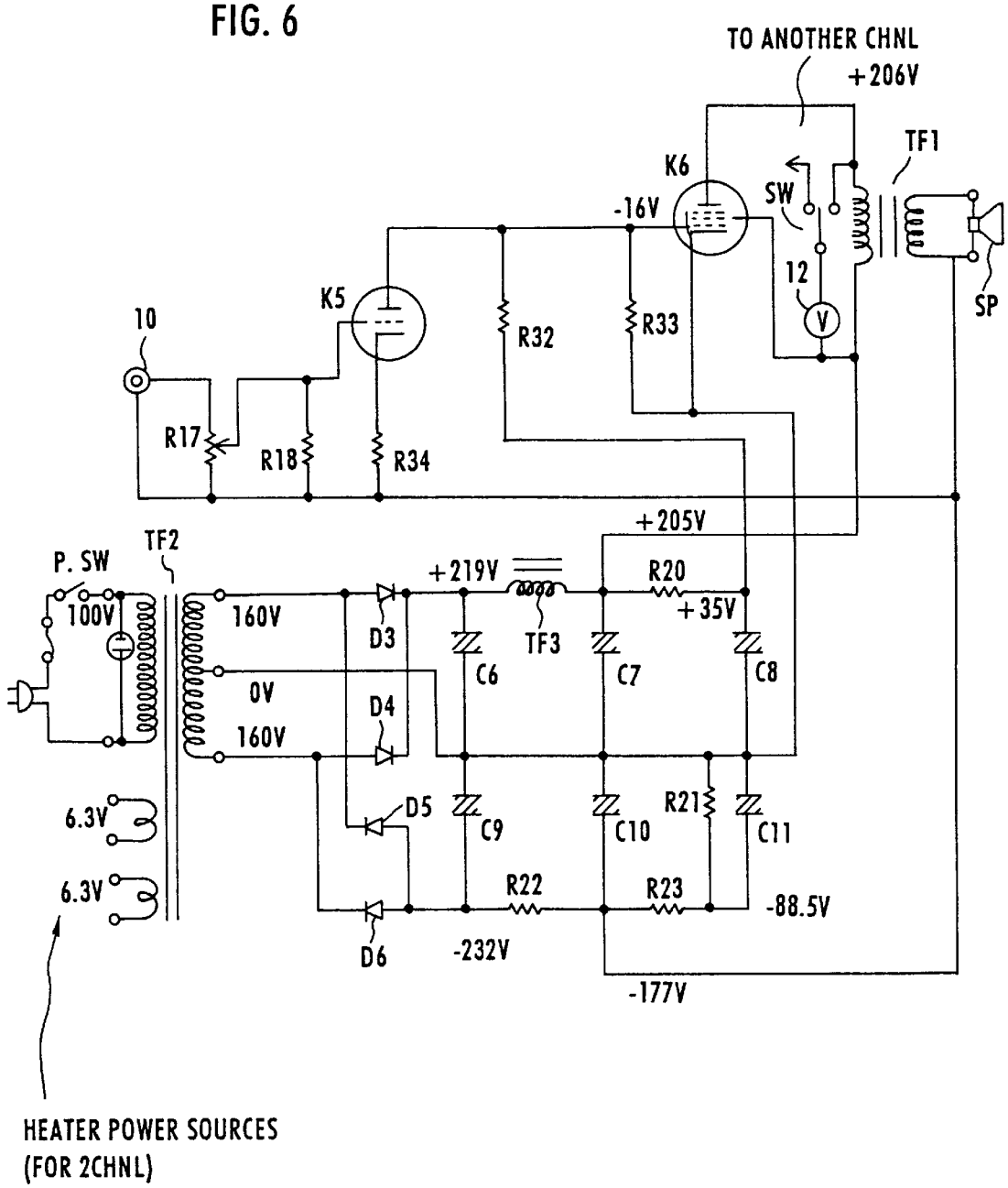
FIG. 6 is a wiring diagram of a fifth embodiment of the tube amplifier according to the present invention.

In the following, a fifth embodiment of the present invention will be described with reference to FIG. 6. The fifth embodiment of FIG. 6 does not require the auxiliary circuit shown in FIG. 2. The sixth embodiment is a kind of a modification of the third embodiment and differs from the third embodiment in that the tube K1, the resistors R15, R31 are removed, and the tubes K2 and K4 are respectively replaced with a triode K5 and a pentode K6. The plate of the tube K5 is directly connected to the first grid of the tube K6, and is applied with a positive voltage through a resistor R32, and the second grid of the tube K6 is also applied with a positive voltage. The cathode of the tube K6 is applied with a zero voltage relative to a plate voltage thereof, and the first grid of the tube K6 is connected to the cathode thereof through a resistor R33. Furthermore, the resistor R19 in the third embodiment is now replaced with a resistor R34 whose resistance is desirably 680 Ω. The resistors R32 and R33 should desirably have resistances of 22k Ω and 4.7M Ω respectively. Other resistors of the fifth embodiment are the same as those in the third embodiment. Although the tube K1 is removed, the fifth embodiment operates in a manner similar to the third embodiment. The tubes K5 and K6 may be either different tubes or a multiple-unit tube. One example of such a multiple-unit tube is 6BM8. Since the tube K1 is removed, the fifth embodiment requires fewer parts, thus providing a further simplification. Comparing the fifth embodiment of FIG. 6 with the third embodiment of FIG. 4, it can be said that the tube K1 of the third embodiment is replaced with the resistor R32. As a result, the fifth embodiment operates in a manner similar to the third embodiment. When the tube 6BM8 is used to function as two tubes K5 and K6, the K4 heater power source circuit, producing positive and negative 5 V in the third embodiment, is unnecessary. Further comparing the fifth embodiment with the third embodiment, since the auxiliary circuit of FIG. 2 is unnecessary, the number of parts is remarkably reduced so that the circuit configuration is quite simple, and is provided at a low cost.

Figure 7:
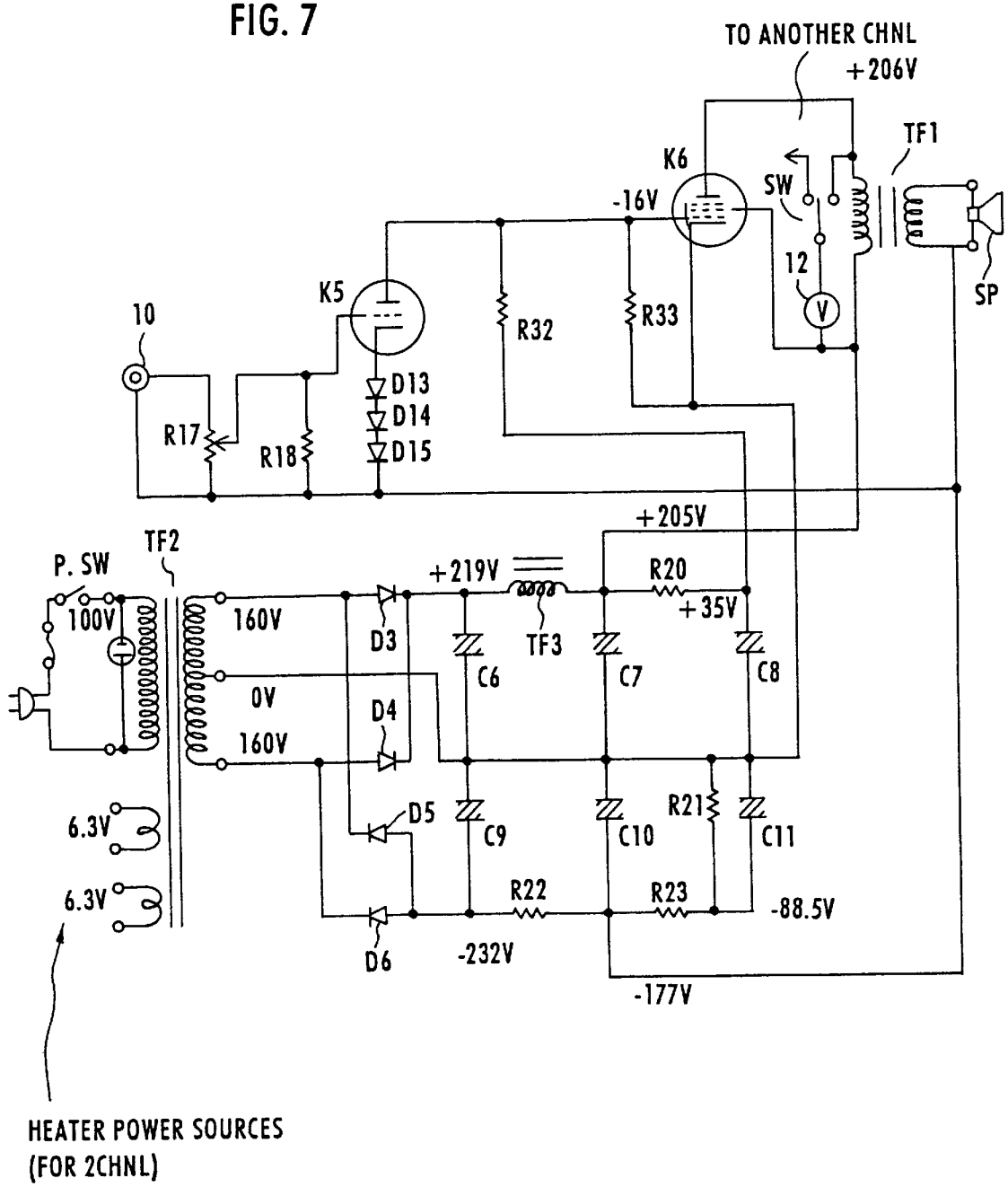
FIG. 7 is a wiring diagram of a sixth embodiment of the tube amplifier according to the present invention.

In the following, a sixth embodiment of the present invention will be described with reference to FIG. 7. The sixth embodiment is a modification of the fifth embodiment and differs from the fifth embodiment in that the resistor R34 is replaced with one or more diodes connected in series. In the illustrated example, three series connected diodes D13, D14, D15 are used. The sixth embodiment operates in the same manner as the fifth embodiment.

Figure 8:
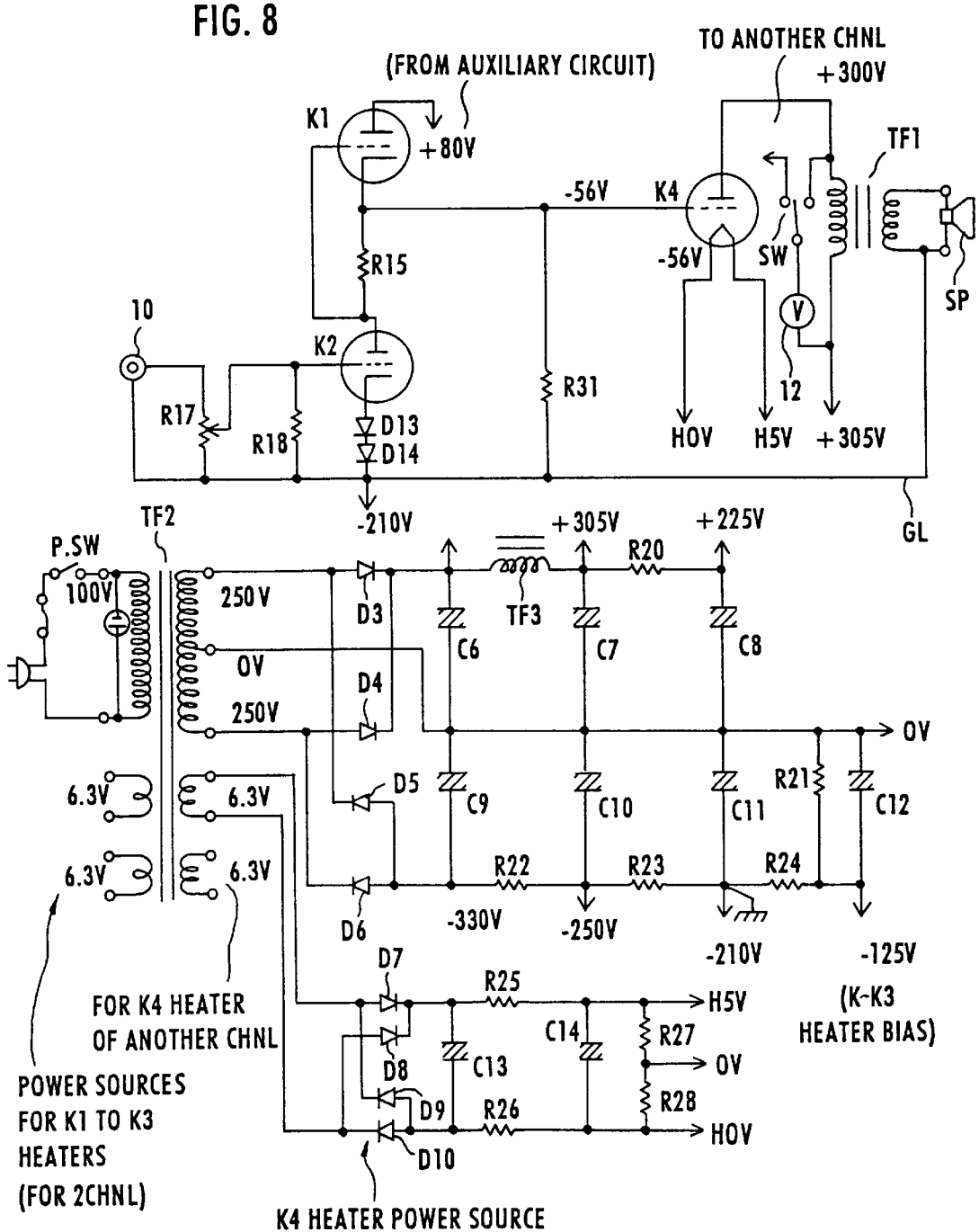
FIG. 8 is a wiring diagram of a seventh embodiment of the tube amplifier according to the present invention.

In the following, a seventh embodiment of the present invention will be described with reference to FIG. 8. The seventh embodiment is a modification of the fourth embodiment and differs from the fourth embodiment in that the diodes D11, D12 are replaced with a single resistor R15. The vacuum tube K2 of the seventh embodiment operates in the same manner as the fourth embodiment, while the vacuum tube K1 of the seventh embodiment operates in the same manner as the third embodiment.

Figure 9:
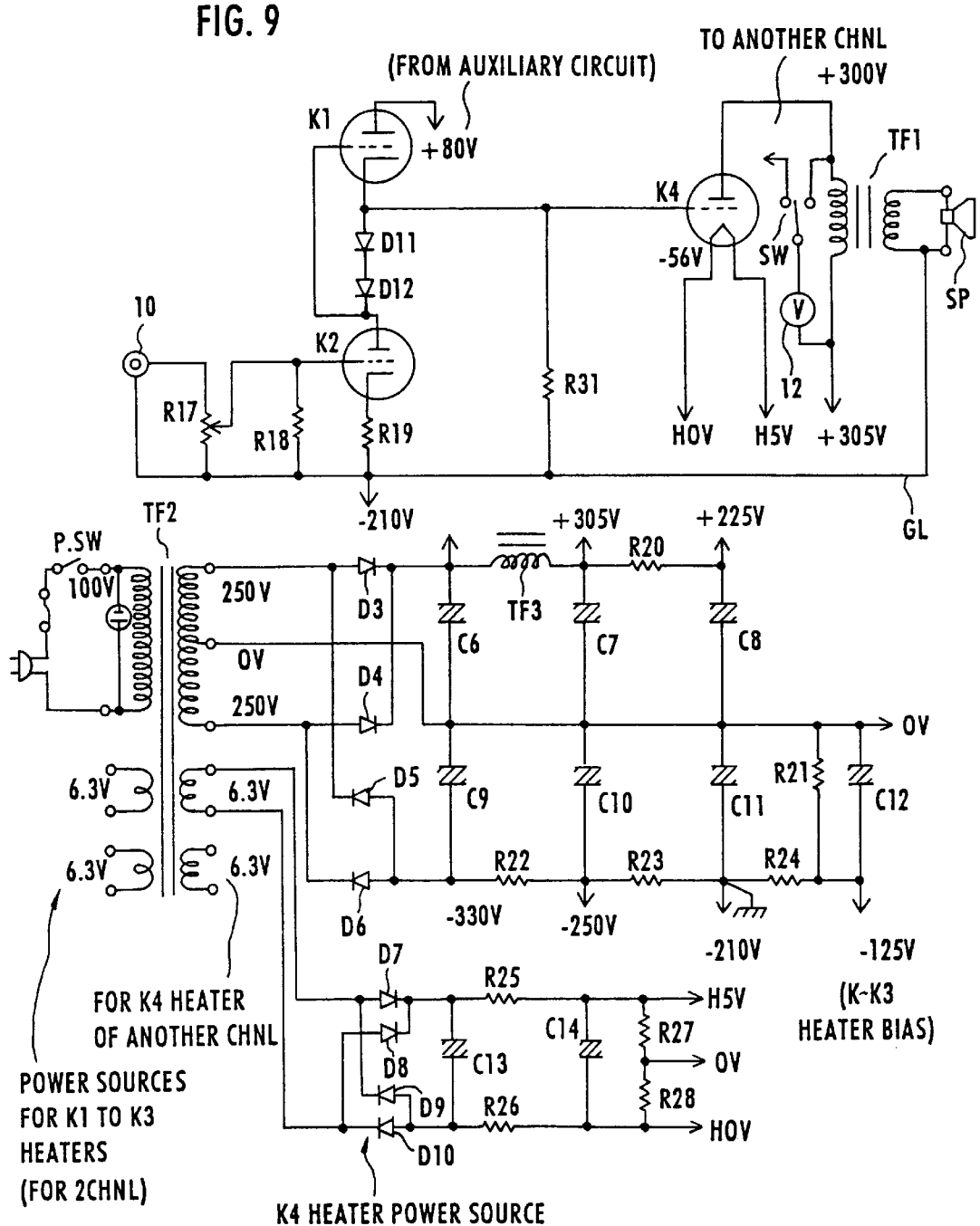
FIG. 9 is a wiring diagram of an eighths embodiment of the tube amplifier according to the present invention.

In the following, an eighth embodiment of the present invention will be described with reference to FIG. 9. The eighth embodiment is a modification of the fourth embodiment and differs from the fourth embodiment in that the diodes D13, D14 are replaced with a single resistor R19. The vacuum tube K1 of the eighth embodiment operates in the same manner as the fourth embodiment, while the vacuum tube K2 of the seventh embodiment operates in the same manner as the third embodiment.

What is claimed is:

1. A tube amplifier comprising:
    a first vacuum tube forming a preceding stage and having a plate applied with a positive voltage and a cathode applied with a negative voltage through a resistor;
    a second vacuum tube having a grid connected to the cathode of the first vacuum tube, said second vacuum tube having a cathode or a heater applied with a voltage close to zero relative to a plate voltage thereof;
    a third vacuum tube having a plate connected to the grid of the first vacuum tube, a grid applied with an input signal, and a cathode applied with a negative voltage through a resistor, said plate of said third vacuum tube being connected to said cathode of said first vacuum tube with a resistor being inserted therebetween; and
    an output transformer having a first coil and a second coil to which is connected a loud-speaker, said first coil having a terminal connected to the plate of the second vacuum tube and another terminal applied with a positive voltage.

2. A tube amplifier according to claim 1, further comprising means for setting the negative voltage to be applied to the grid of the second vacuum tube to a desired value, by changing the positive voltage to be applied to the plate of the first vacuum tube.

3. A tube amplifier comprising:
    a first vacuum tube forming a preceding stage and having a plate applied with a positive voltage and a cathode applied with a negative voltage through a resistor;
    a second vacuum tube having a grid connected to the cathode of the first vacuum tube, said second vacuum tube having a cathode or a heater applied with a voltage close to zero relative to a plate voltage thereof;
    a third vacuum tube having a plate connected to the grid of the first vacuum tube, a grid applied with an input signal, and a cathode applied with a negative voltage through one or more diodes, said plate of said third vacuum tube being connected to said cathode of said first vacuum tube with a resistor being inserted therebetween; and
    an output transformer having a first coil and a second coil to which is connected a loud-speaker, said first coil having a terminal connected to the plate of the second vacuum tube and another terminal applied with a positive voltage.

4. A tube amplifier according to claim 3, further comprising means for setting the negative voltage to be applied to the grid of the second vacuum tube to a desired value, by changing the positive voltage to be applied to the plate of the first vacuum tube.

5. A tube amplifier comprising:
    a first vacuum tube forming a preceding stage and having a plate applied with a positive voltage and a cathode applied with a negative voltage through a resistor;
    a second vacuum tube having a grid connected to the cathode of the first vacuum tube, said second vacuum tube having a cathode or a heater applied with a voltage close to zero relative to a plate voltage thereof;
    a third vacuum tube having a plate connected to the grid of the first vacuum tube, a grid applied with an input signal, and a cathode applied with negative voltage through a resistor, said plate of said third vacuum tube being connected to said cathode of said first vacuum tube with one or more diodes being inserted therebetween; and
    an output transformer having a first coil and a second coil to which is connected a loud-speaker, said first coil having a terminal connected to the plate of the second vacuum tube and another terminal applied with a positive voltage.

6. A tube amplifier according to claim 5, further comprising means for setting the negative voltage to be applied to the grid of the second vacuum tube to a desired value, by changing the positive voltage to be applied to the plate of the first vacuum tube.

7. A tube amplifier comprising:
    a first vacuum tube forming a preceding stage and having a plate applied with a voltage through a resistor, a grid applied with an input signal and with a negative voltage through a resistor, and a cathode applied with a negative voltage through a resistor, the resistance of said resistor for supplying the plate with the voltage and the resistance of said resistor for supplying the cathode with the negative voltage being selected such that the plate voltage is a negative voltage;
    a second vacuum tube having a first grid connected to the plate of the first vacuum tube, a second grid applied with a positive voltage, said second tube having a cathode applied with a voltage close to zero voltage relative to a plate voltage thereof, said first grid of said second vacuum tube being connected to said cathode thereof through a resistor; and
    an output transformer having a first coil and a second coil to which is connected a loud-speaker, said first coil having a terminal connected to the plate of the second vacuum tube and another terminal applied with a positive voltage.

8. A tube amplifier comprising:
    a first vacuum tube forming a preceding stage and having a plate applied with a voltage through a resistor, a grid applied with an input signal and with a negative voltage through a resistor, and a cathode applied with a negative voltage through one or more diodes, the resistance of said resistor for supplying the plate with the voltage and the resistance of said resistor for supplying the cathode with the negative voltage being selected such that the plate voltage is a negative voltage;

a second vacuum tube having a first grid connected to the plate of the first vacuum tube, a second grid applied with a positive voltage, said second tube having a cathode applied with a voltage close to zero voltage relative to a plate voltage thereof, said first grid of said second vacuum tube being connected to said cathode thereof through a resistor; and an output transformer having a first coil and a second coil to which is connected a loud-speaker, said first coil having a terminal connected to the plate of the second vacuum tube and another terminal applied with a positive voltage.

9. A tube amplifier comprising:

a first vacuum tube forming a preceding stage and having a plate applied with a positive voltage and a cathode applied with a negative voltage through a resistor;

a second vacuum tube having a grid connected to the cathode of the first vacuum tube, said second vacuum tube having a cathode or a heater applied with a voltage close to zero relative to a plate voltage thereof;

a third vacuum tube having a plate connected to the grid of the first vacuum tube, a grid applied with an input signal, and a cathode applied with a negative voltage through one or more diodes, said plate of said third vacuum tube being connected to said cathode of said first vacuum tube with one or more diodes inserted therebetween; and an output transformer having a first coil and a second coil to which is connected a loud-speaker, said first coil having a terminal connected to the plate of the second vacuum tube and another terminal applied with a positive voltage.

* * * * *